April 14, 1970 G. E. HARE ET AL 3,505,728

METHOD OF MAKING THERMOELECTRIC MODULES

Filed Sept. 1, 1967

United States Patent Office 3,505,728
Patented Apr. 14, 1970

3,505,728
METHOD OF MAKING THERMOELECTRIC MODULES

Gerald Edward Hare, Ottawa, Ontario, Canada, and Frank Neighbour, Wantage, England, assignors to United Kingdom Atomic Energy Authority, London, England Filed Sept. 1, 1967, Ser. No. 665,173
Int. Cl. H01l 7/02
U.S. Cl. 29—573 5 Claims

ABSTRACT OF THE DISCLOSURE

The bismuth telluride based elements of a thermoelectric module are electrically connected by metallic, preferably gold, straps which are simply pressed against the elements and heated to form an alloy bond with the elements, the temperature for gold being 460° C.

BACKGROUND OF THE INVENTION

This invention relates to theremoelectric modules.

Thermoelectric modules now commonly comprise a series of bars or rods of semiconducting thermoelectric material which form the individual thermocouple members and which are arranged side-by-side in a rectangular array. The thermocouple members are held together, and are electrically insulated from one another, by intervening thin layers of a suitable encapsulating material. The ends of the thermocouple members are exposed and are electrically connected in pairs to form a series-connected arrangement.

It is difficult to make such connections really satisfactory, at least in cases where the thermocouple elements are form of bismuth telluride or an alloy thereof (hereinafter referred to as bismuth telluride based material). The main problems arise because the thermoelectric voltages developed are small, and the connections must therefore be of low resistance, and because it is essential that the material of the connections shall not diffuse into the thermocouple elements and poison them.

SUMMARY OF THE INVENTION

It is therefore an object of the present invention to provide a new or improved method of making such connections.

According to the present invention, there is provided a thermoelectric device and a method of making same by providing electrical connections between pairs of thermocouple members in a thermoelectric module, wherein the thermocouple members are formed of a bismuth telluride based material. The method comprises thermocompression bonding including the steps of providing a layer of an electrically conducting material which is compatible with the thermocouple material, i.e. will not poison the thermocouple members, so as to bridge a pair of thermocouple members to be connected, and pressing said layer against said thermocouple members whilst heating said layer to a temperature below the melting point of said layer or of the material of the thermocouple elements but sufficient to cause alloy bonding of said layer to the thermocouple elements, these steps being performed for each pair of thermocouple members to be connected.

Preferably the electrically conducting material is in the form of a gold strap, and the alloy bonding is brought about by the direct pressure on said strap of a suitably shaped electrically heated presser foot.

BRIEF DESCRIPTION OF THE DRAWINGS

A method of making electrical connection between pairs of thermocouple members in a thermoelectric module, the method being in accordance with the present invention, will now be described by way of example with reference to the accompanying drawing, in which.

DESCRIPTION OF THE PREFERRED EMBODIMENT

Figure 1:
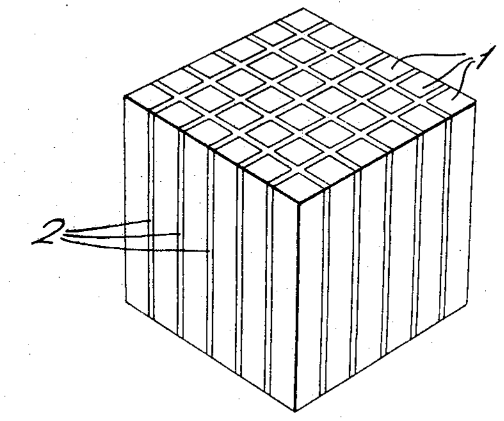
FIGURE 1 is a perspective view of an unfinished thermoelectric module.

Referring to FIGURE 1 of the drawing, the module comprises a series of bars of semiconducting thermoelectric material, made by a powder metallurgy technique, which form the individual thermocouple members 1, and which are arranged side-by-side in a rectangular array. The thermocouple members are held together, and are electrically insulated from one another, by intervening thin layers of an epoxy resin encapsulating material 2. The thermocouple members 1 are formed of a bismuth telluride based material, such as, for example, bismuth telluride, bismuth selenide ($Bi_2Te_3$, $Bi_2Se_3$) or bismuth telluride, antimony telluride ($Bi_2Te_3$, $Sb_2Te_3$). Alternate thermocouple members 1 in each row and column of the array are of different conductivity type (p-type and n-type). The ends of the thermocouple members 1 are exposed and are to be connected in pairs to form a series-connected arrangement.

Figure 2:
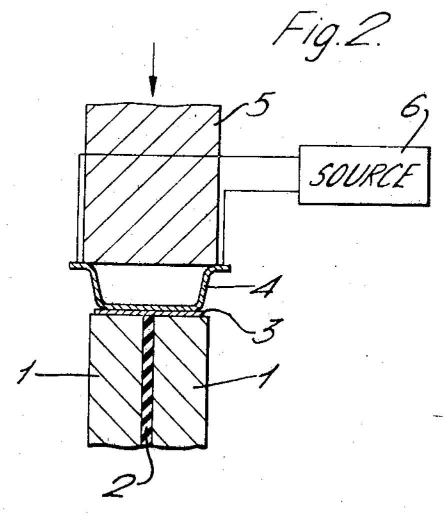
FIGURE 2 shows diagrammatically the making of a connection.

Referring to FIGURE 2 of the drawing, the connections are made by bridging the ends of two adjacent thermocouple members 1 to be connected with a strap 3 of gold five to twenty thousandths of an inch in thickness. The strap 3 is pressed into contact with the ends of the thermocouple elements 1 by the flat undersurface of a presser foot 4 consisting of a rigid Nichrome heater ribbon carried at the lower end of a vertically movable arm 5. Electric current is supplied by a source 6 to the foot 4 to maintain it at a temperature of some 460° C. At this temperature the interfaces between the strap 3 and the ends of the thermocouple members 1 are alloy bonded together, although the temperature is below the melting point of gold or of the thermoelectric material. A stop (not shown) is provided to limit the downward movement of the arm such that at the lower limit the strap 3 is embedded to about half its thickness into the end faces of the thermoelectric elements. The resulting connection has a very low resistance (of the order of 10 microhoms per sq. cm.) and does not cause poisoning of the thermoelectric material.

The steps described above are repeated until all the desired connections have been made, and clearly more than one connection can be made at a time by means of a suitable jig. There may, however, be advantages in making them singly, as this makes it somewhat easier to monitor individual connections for quality control during manufacture.

It is not essential that the gold for the connection be in the form of a prepared strap 3. Thus the end of the module may be suitably masked, and the gold deposited to the required thickness by evaporation, electroplating or plasma flame spraying, followed by heating to alloying temperature. In lieu of gold, the bridging member may be silver.

It may be found desirable to slightly undercut the encapsulating material 2 at the end faces where the straps 3 are applied to minimise any tendency for said material to creep over the end faces when making the connections thus affecting the efficacy of the bonding.

We claim:

1. A method of making an electrical connection between a pair of bismuth telluride based thermoelectric elements in a thermoelectric device, said elements being electrically insulated from one another, comprising the steps of:

(a) applying a bridging layer of gold or silver to said elements, (b) pressing said layer into close contact with the elements whilst heating said layer to form an alloy bond with the elements.

2. A method as claimed in claim 1 wherein said layer is of gold.

3. A method as claimed in claim 2 wherein the gold layer is applied by placing a strap of gold foil in bridging contact with the elements.

4. A method as claimed in claim 3 wherein the strap is heated to a temperature of 460° C. by a heated presser foot.

5. A method as claimed in claim 4 wherein the strap is pressed into the elements to depth corresponding to half the thickness of the strap.

References Cited

UNITED STATES PATENTS

| | | | |
|---|---|---|---|
| 3,050,574 | 8/1962 | Rosi | 29—573 |
| 3,091,849 | 4/1963 | Cohen | 29—497.5 |
| 3,100,254 | 8/1963 | Perkins | 29—497.5 |
| 3,228,104 | 1/1966 | Eneis | 29—497.5 |
| 3,252,205 | 5/1966 | Hancock et al. | 29—573 |
| 3,276,105 | 10/1966 | Alais et al. | 29—573 |
| 3,298,095 | 1/1967 | Hicks | 29—497.5 |
| 3,403,438 | 10/1968 | Best et al. | 29—497.5 |
| 3,298,095 | 1/1967 | Hicks | 29—573 |

PAUL M. COHEN, Primary Examiner

U.S. Cl. X.R.

29—497.5, 504